United States Patent
Moto et al.

(10) Patent No.: US 6,791,159 B2
(45) Date of Patent: Sep. 14, 2004

(54) OPTICAL MODULE

(75) Inventors: Akihiro Moto, Yokohama (JP);
Tomokazu Katsuyama, Yokohama (JP)

(73) Assignee: Sumitomo Electric Industries, Ltd., Osaka (JP)

(*) Notice: Subject to any disclaimer, the term of this patent is extended or adjusted under 35 U.S.C. 154(b) by 0 days.

(21) Appl. No.: 10/452,938

(22) Filed: Jun. 3, 2003

(65) Prior Publication Data

US 2004/0047540 A1 Mar. 11, 2004

(30) Foreign Application Priority Data

Jun. 3, 2002 (JP) .................................. 2002-161958
Nov. 28, 2002 (JP) .................................. 2002-345953

(51) Int. Cl.[7] .................................. H01L 29/00; H01L 29/22
(52) U.S. Cl. .................................. 257/531; 257/99
(58) Field of Search .................................. 257/528, 531, 257/79, 99

(56) References Cited

U.S. PATENT DOCUMENTS

2002/0175799 A1 * 11/2002 Nielson .................. 336/200

2003/0094697 A1 * 5/2003 Higashida et al. ........... 257/758

FOREIGN PATENT DOCUMENTS

| JP | 11-243254 | 9/1999 |
| JP | 2002-270942 | 9/2002 |
| JP | 2002-374028 | 12/2002 |

* cited by examiner

Primary Examiner—Ngâan V. Ngô
(74) Attorney, Agent, or Firm—McDermott Will & Emery LLP (57) ABSTRACT

The present invention reduces the capacitance components of pads to improve high frequency characteristics. An optical module includes a light emitting element having an electrode to which a bias current is supplied, an interconnect substrate on which an interconnect pattern is formed to supply the bias current, and a ferrite bead inductor having one terminal connected to a pad connected to the electrode using a bonding wire and the other terminal connected to a pad as the interconnect pattern.

9 Claims, 14 Drawing Sheets

OPTICAL MODULE

This application claims priority from Japanese Patent Application Nos. 2002-161958 filed Jun. 3, 2002 and 2002-345953 filed Nov. 28, 2002, which are incorporated hereinto by reference.

BACKGROUND OF THE INVENTION

1. Field of the Invention

The present invention relates to an optical module used in an optical transmission system and operating at a high speed over a wide band.

2. Description of the Related Art

In recent years, optical transmission systems using optical fibers as a transmission medium have had an increased transmission capacity. Efforts have been made to increase the speed of a circuit such as an optical transmitting and receiving device used in the system and widen a transmission band used by the circuit. For example, a circuit used in a 40-Gb/s optical transmission system is desired to operate over a wide band from about several dozen kHz to about 50 GHz. Among such circuits, MMICs (Microwave Monolithic Integrated Circuits) are known in which an active element, a passive element, and a transmission line are integrated together on a semiconductor substrate to form a circuit providing a plurality of functions. Further, Japanese Patent Application Laid-Open No. 2002-270942 discloses an optical module comprising a housing containing an optical element such as a light emitting element or a light receiving element and an MMIC that forms a driving circuit or an amplifying circuit through integration.

Figure 1A:
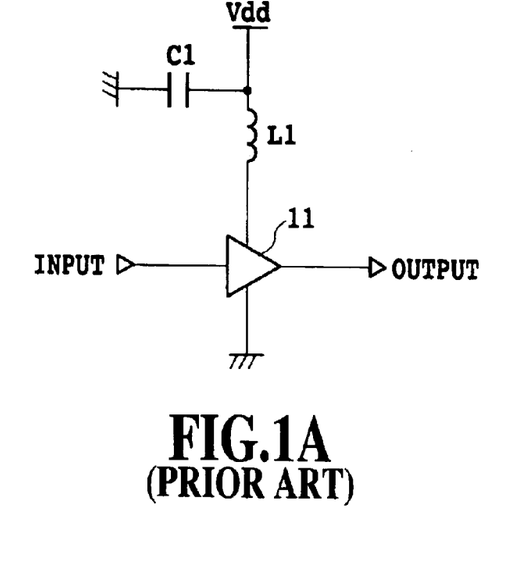
FIG. 1A is a circuit diagram showing a configuration of a conventional MMIC.

FIG. 1A is a circuit diagram of a conventional MMIC. A power source Vdd is connected to an IC 11. A bias capacitor C1 is connected to the power source Vdd to remove power source noise. The IC 11 is, for example, a pre-amplifier in an optical receiver that operates in a high frequency area. In the MMIC, an LC filter is formed in a power line in order to prevent a high frequency signal in the IC 11 from intruding into the power line as a noise.

Figure 1B:
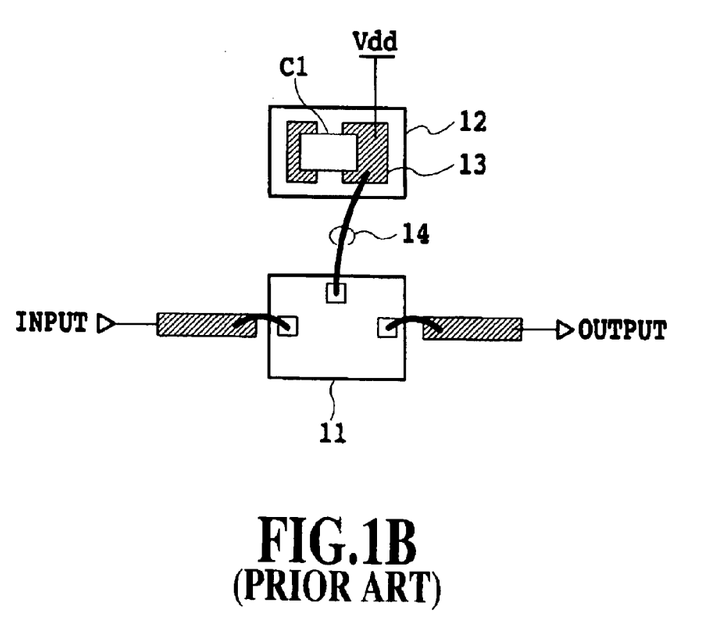
FIG. 1B is an assembly diagram showing the configuration of the MMIC shown in FIG. 1A.

FIG. 1B is an assembly diagram of the MMIC shown in FIG. 1A. An inductance element forming the LC filter is generally expensive and has a larger occupied area than the MMIC. Thus, efforts have been made to make a value for an inductance component L1 significant by increasing the length of a bonding wire 14 extending from a pad 13 on an assembly substrate 12 for the power source Vdd to the IC 11.

Figure 2A:
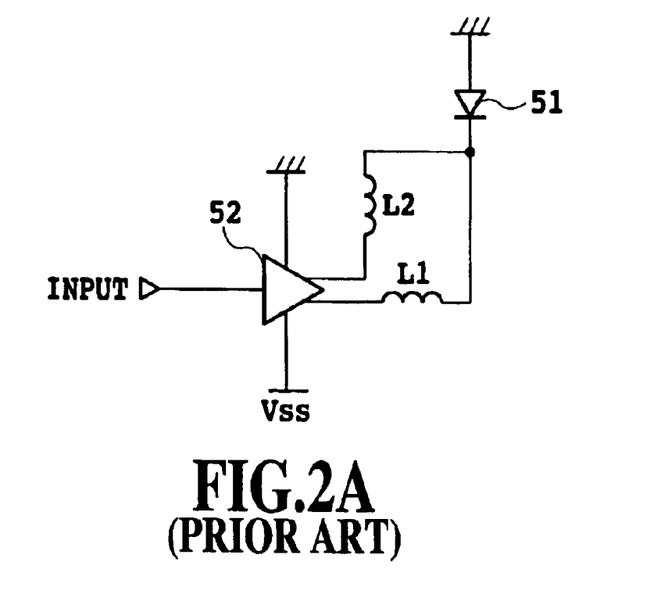
FIG. 2A is a circuit diagram showing a configuration of a conventional optical transmitter.

FIG. 2A shows a configuration of a circuit in a conventional optical transmitter. A driving circuit 52 supplies a bias current to a light emitting element 51 via the inductance component L1. The driving circuit 52 supplies a modulating current corresponding to an electric signal inputted to the light emitting element 61. The value for the inductance component L1 must be increased so as to prevent an AC component of the modulating current from affecting a bias current supplying circuit in the driving circuit 52, the AC component being supplied to the light emitting element 51 by the driving circuit 52.

Figure 2B:
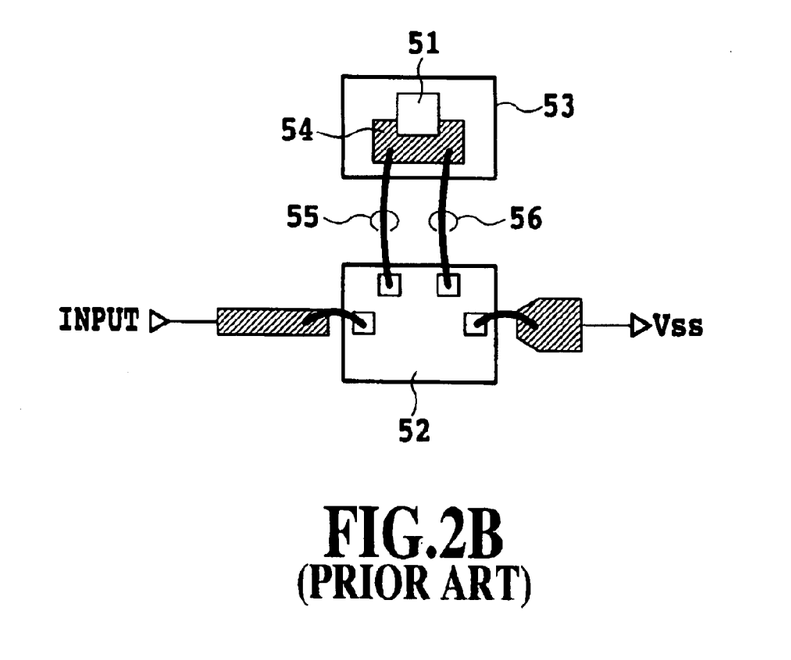
FIG. 2B is an assembly diagram showing the configuration of the optical transmitter shown in FIG. 2A.

FIG. 2B shows a configuration of the assembled optical transmitter shown in FIG. 2A. The inductance element is generally expensive and has a larger occupied area than the light emitting element. Thus, efforts have been made to increase the value for the inductance element L1 by increasing the length of a power supplying bonding wire extending from a pad 54 on a heat sink 53 on which the light emitting element is mounted.

However, to obtain the inductance component L1, the bonding wire 14 or 55 must have a length of several cm, requiring an assembly space. Further, owing to its insufficient strength, the wire may be broken. Then, disadvantageously, the circuit may become unreliable. Furthermore, the optical transmitter must have a long bonding wire 56 for a modulating current supply. Thus, disadvantageously, modulation characteristics in a high frequency area may be degraded.

Figure 3A:
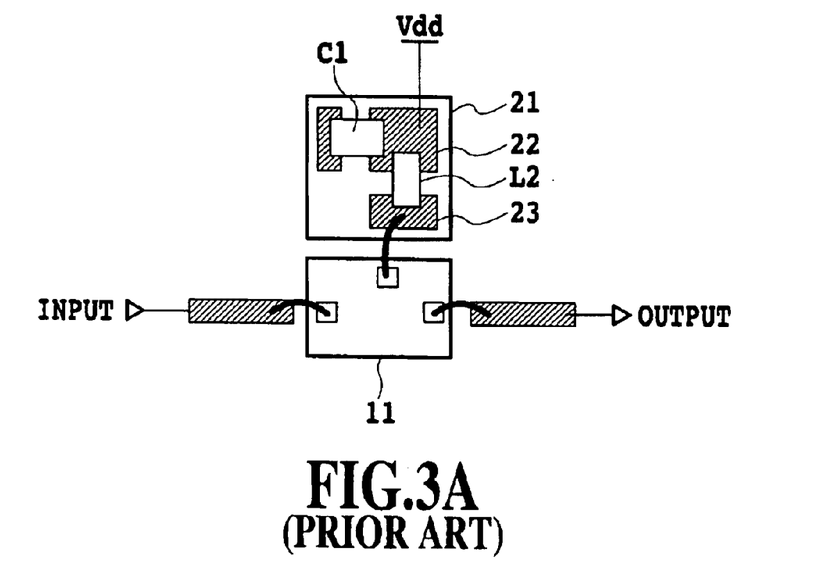
FIG. 3A is a circuit diagram showing a configuration of an MMIC using a conventional ferrite bead inductor.
Figure 3B:
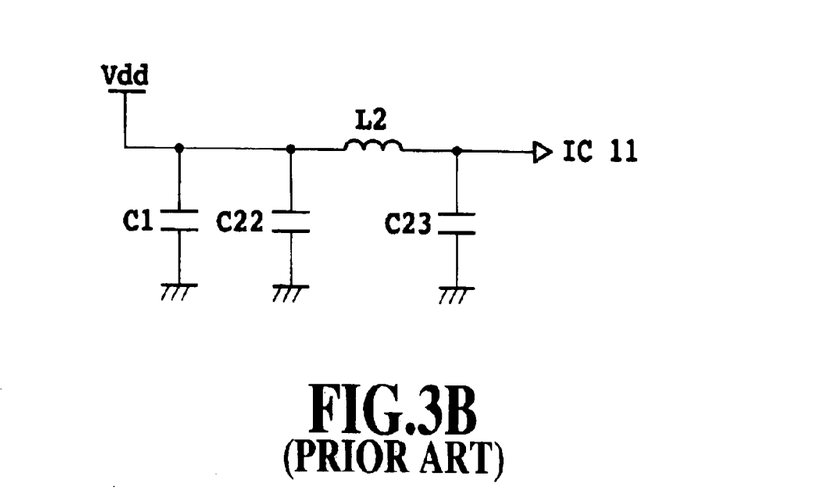
FIG. 3B is a circuit diagram showing an equivalent circuit for a power line in the MMIC shown in FIG. 3A.

Thus, a method is known which uses a ferrite bead inductor. FIG. 3A shows a configuration of a circuit in an MMIC using a conventional ferrite bead inductor. An LC filter is constructed on an assembly substrate 21 for the power source Vdd by using a bypass capacitor C1 and a ferrite bead inductor L2. FIG. 3B shows an equivalent circuit for a power line. Pads 22 and 23 used to mount parts on the assembly substrate have capacitance components C22 and C23, respectively, if the substrate is made of ceramics and has its back surface grounded. For example, for a ceramic substrate having a relative dielectric constant of 9, a thickness of 200 μm, a pad area of 500×2000 μm, the capacitance components C22 and C23 are each about 0.4 pF.

Resonance occurs between the capacitance components C22 and C23 and the ferrite bead inductor L2. The resonance is reflected in an output from the IC 11 via the power line. Then, disadvantageously, this appears as a gain dip if the IC 11 is an amplifier. This increases jitters in output waveforms.

Figure 4A:
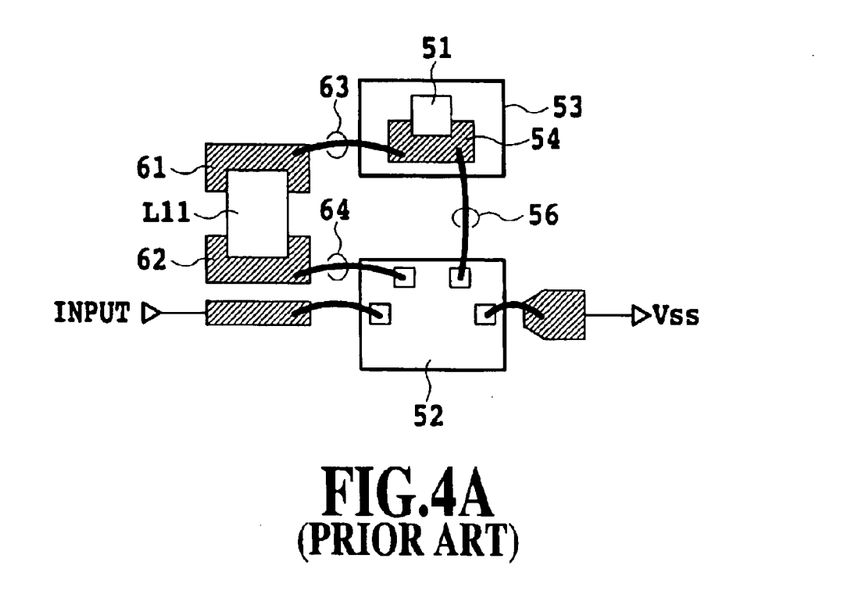
FIG. 4A is a circuit diagram showing a configuration of an optical transmitter using a conventional ferrite bead inductor.
Figure 4B:
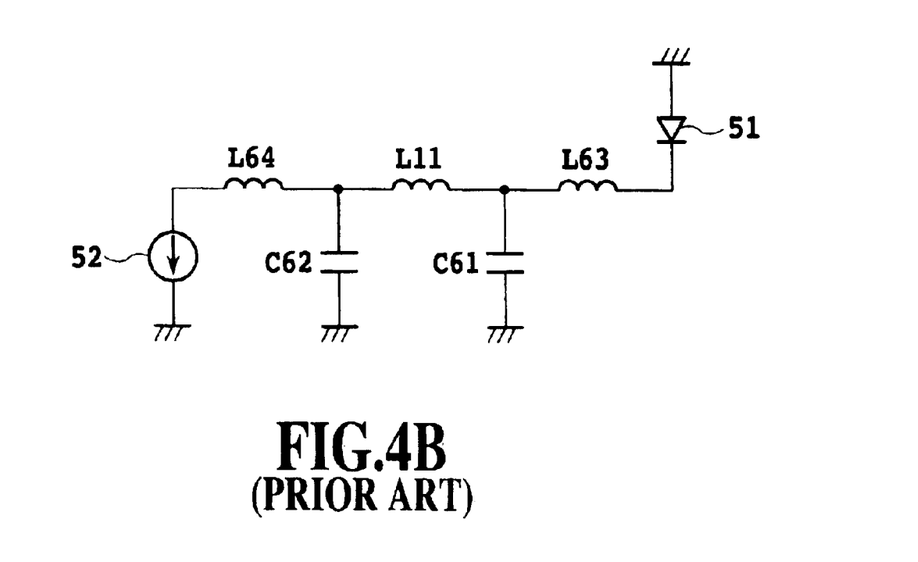
FIG. 4B is a circuit diagram showing an equivalent circuit for a bias line in the optical transmitter shown in FIG. 4A.

FIG. 4A shows a configuration of a circuit in an optical transmitter using the conventional ferrite bead inductor. The light emitting element 51 and the driving circuit 52 are connected together via a ferrite bead inductor L11 in place of the bias current supplying bonding wire 55, shown in FIG. 2B. FIG. 4B shows an equivalent circuit for a bias line. Pads 61 and 62 used to mount the ferrite bead inductor L11 have capacitance components C61 and C62, respectively, if the substrate is made of ceramics and has its back surface grounded.

Resonance occurs between the capacitance components C61 and C62 and both the inductance components L63 and L64 of the bonding wires 63 and 64 and the ferrite bead inductor L2.

SUMMARY OF THE INVENTION

It is an object of the present invention to provide an optical module that reduces the capacitance components of pads to improve high frequency characteristics.

To achieve this object, an optical module comprises a light emitting element having an electrode to which a bias current is supplied, an interconnect substrate on which an interconnect pattern is formed to supply the bias current, and an inductor part having one terminal connected to the electrode using a connection member and the other terminal connected to the interconnect pattern.

This configuration enables a reduction in the area of a pad to which the inductor part is soldered and reduces the capacitance component of the pad. Accordingly, one of the terminals need not be provided with any pads so that this terminal does not provide the capacitance component of a pad. This improves the high frequency characteristics.

The optical module further comprises a driving circuit connected to the interconnect pattern to supply the bias current to the light emitting element.

The driving circuit includes a bias current supplying circuit that supplies the bias current and a modulating current supplying circuit that supplies a modulating current to the light emitting element. The bias current supplying circuit is connected to the interconnect pattern. The modulating current supplying circuit is connected to the electrode without using any inductor parts.

The connection member may be a bonding wire or a bonding ribbon. Further, one of the terminals of an inductance part may be plated with gold.

In another embodiment, the inductor part includes a first metal block plated with gold and an inductance element having a first terminal to which the first metal block is connected and a second terminal.

The first terminal and the second terminal are plated with at least one of solder, tin, and gold. The inductor part includes a second metal block plated with gold. The second metal block may be connected to the second terminal.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Embodiments of the present invention will be described below with reference to the drawings.

Figure 5A:
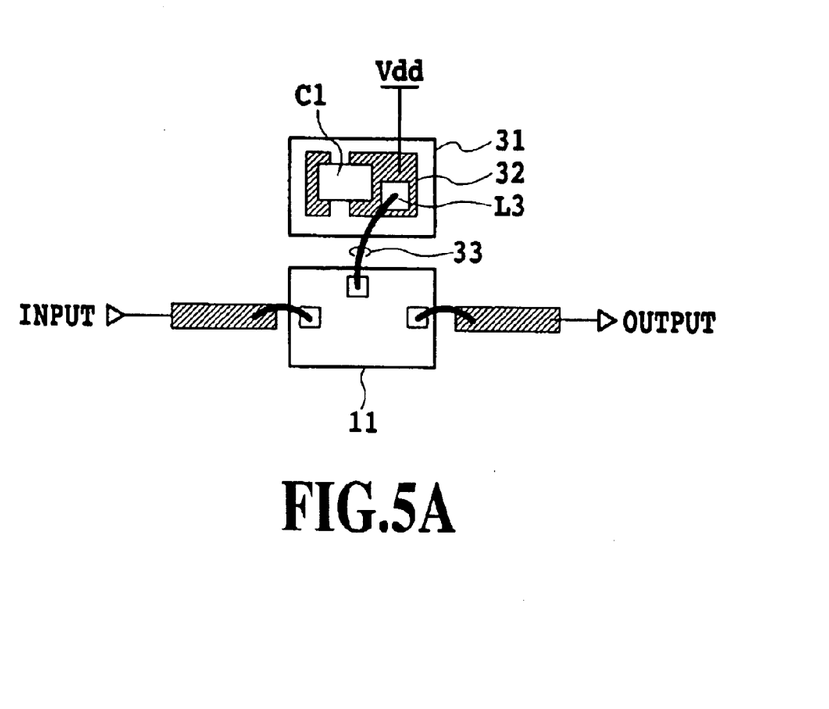
FIG. 5A is an assembly diagram showing a configuration of an MMIC according to an embodiment of the present invention.
Figure 5B:
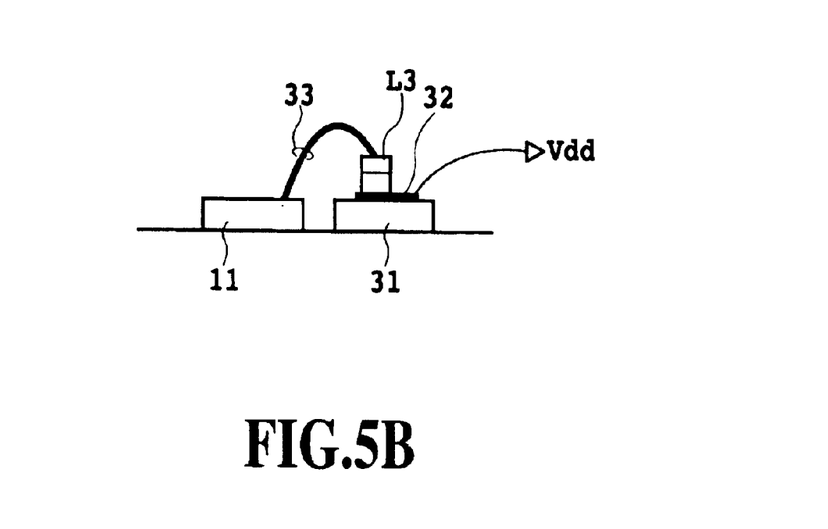
FIG. 5B is a side view showing the MMIC shown in FIG. 5A.

FIG. 5A shows an assembled configuration of an MMIC according to an embodiment of the present invention. An LC filter is constructed on an assembly substrate 31 for a power source Vdd by using a bypass capacitor C1 and a ferrite bead inductor L3. The ferrite bead inductor L3 is assemble on a pad 32 so as to stand up from it. FIG. 5B is a side view of an MMIC. One terminal of the ferrite bead inductor L3 is connected to an LC 11 through bonding wire 33. The other terminal is soldered to the pad 32. The ferrite bead inductor L3 will be described later in detail with reference to FIG. 12.

Thus, one of the terminals of the ferrite bead inductor L3 need not be provided with any pads. Accordingly, this terminal does not provide the capacitance component of a pad.

Figure 6A:
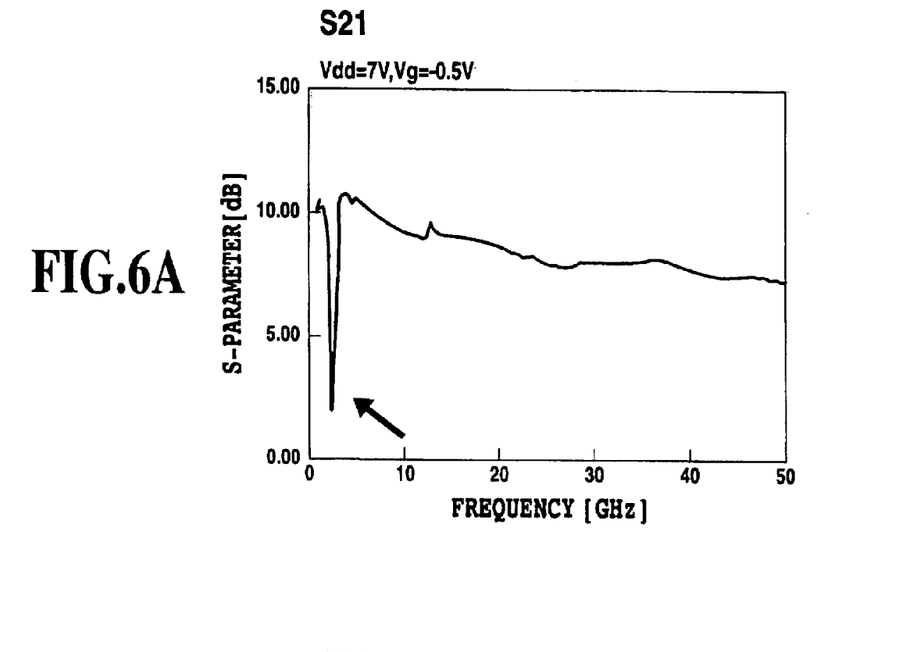
FIG. 6A is a graph showing the I/O characteristics of an IC configured as an amplifier.
Figure 6B:
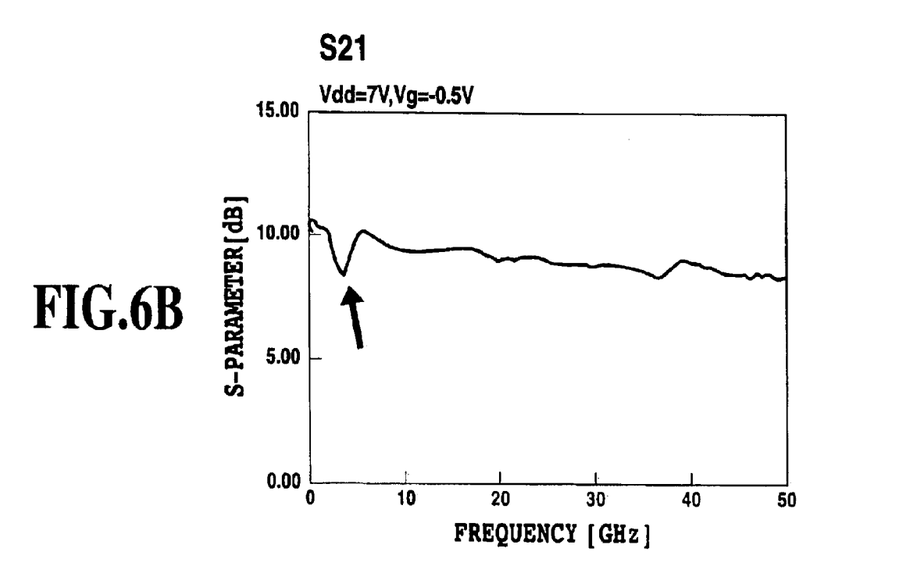
FIG. 6B is a graph showing the I/O characteristics of an amplifier as the MMIC shown in FIG. 5A.

FIG. 6A shows the I/O characteristics of an IC configured as an amplifier. This figure shows the I/O characteristics of the amplifier as the MMIC shown in FIGS. 1A and 1B. The IC 11 is an amplifier used for a 40-Gb/s optical transmission system. FIG. 6A shows the results of an S parameter S21; it shows a large gain dip near a frequency of 2 GHz. FIG. 6B shows the I/O characteristics of the amplifier as the MMIC shown in FIGS. 5A and 5B. This figures shows that the gain dip near a frequency of 2 GHz has been improved. The capacitance component of a pad is not provided at one of the terminals of the ferrite bead inductor L3. This suppresses possible resonance to reduce the gain dip. The 40-Gb/s optical transmission system is desired to reduce the gain dip to 2 dB or less. The present embodiment can meet this requirement.

Figure 7A:
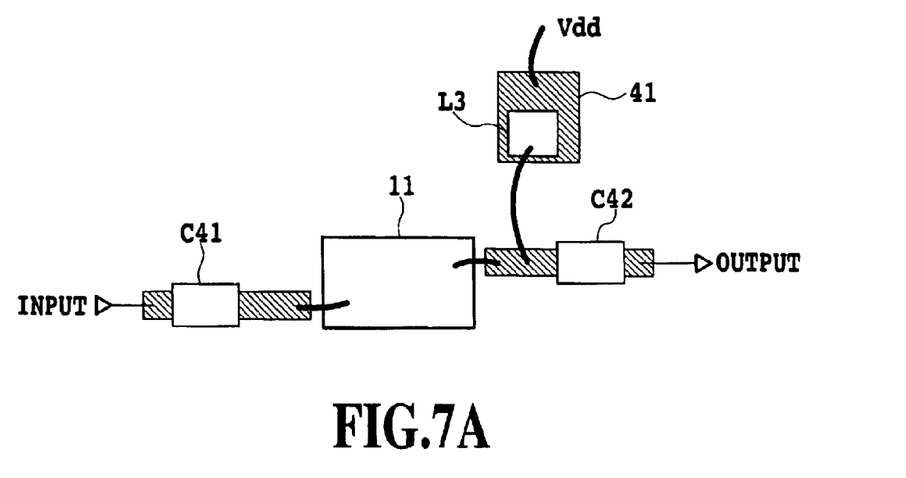
FIG. 7A is an assembly diagram showing an example in which the MMIC according to this embodiment of the present invention is applied to a bias Tee circuit provided at an output terminal of an IC.

The present embodiment has been described in conjunction with the LC filter inserted into the power line of the IC. However, it is also applicable to the applied exampled described below. FIG. 7A shows an example in which an MMIC according to an embodiment of the present invention is applied to a bias Tee circuit provided at the output terminal of the IC 11. The bias Tee circuit is used to set a DC potential to a predetermined value at the output terminal of the IC 11.

The DC potential is provided by the power source Vdd via the ferrite bead inductor L3. A capacitive element C42 hinders DC components to output only AC components from the output terminal of the IC 11.

Figure 7B:
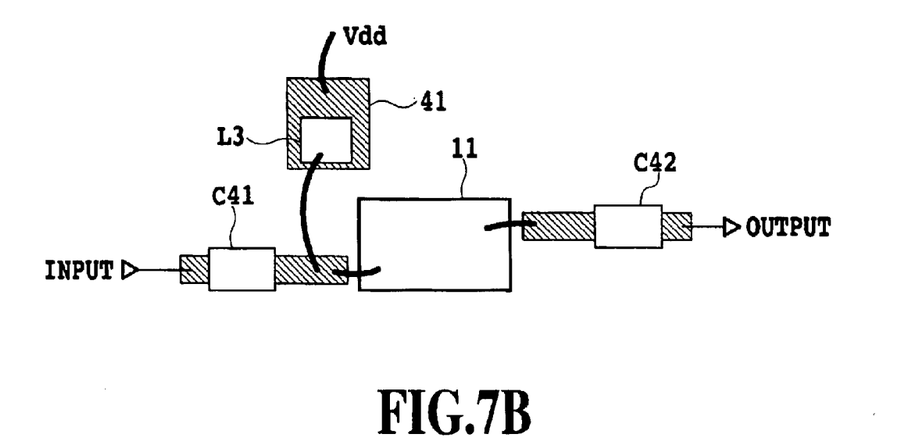
FIG. 7B is an assembly diagram showing an example in which the MMIC according to this embodiment of the present invention is applied to a bias Tee circuit provided at an input terminal of an IC.

FIG. 7B is an example in which the MMIC according to this embodiment of the present invention is applied to a bias Tee circuit provided at the input terminal of the IC 11. The bias Tee circuit has functions similar to those in FIG. 7A. The ferrite bead inductor L3 is assembled on a pad 41 so as to stand up from it. Accordingly, the capacitance component of a pad is not provided at one of the terminals. It is thus possible to correct the gain dip.

Figure 8A:
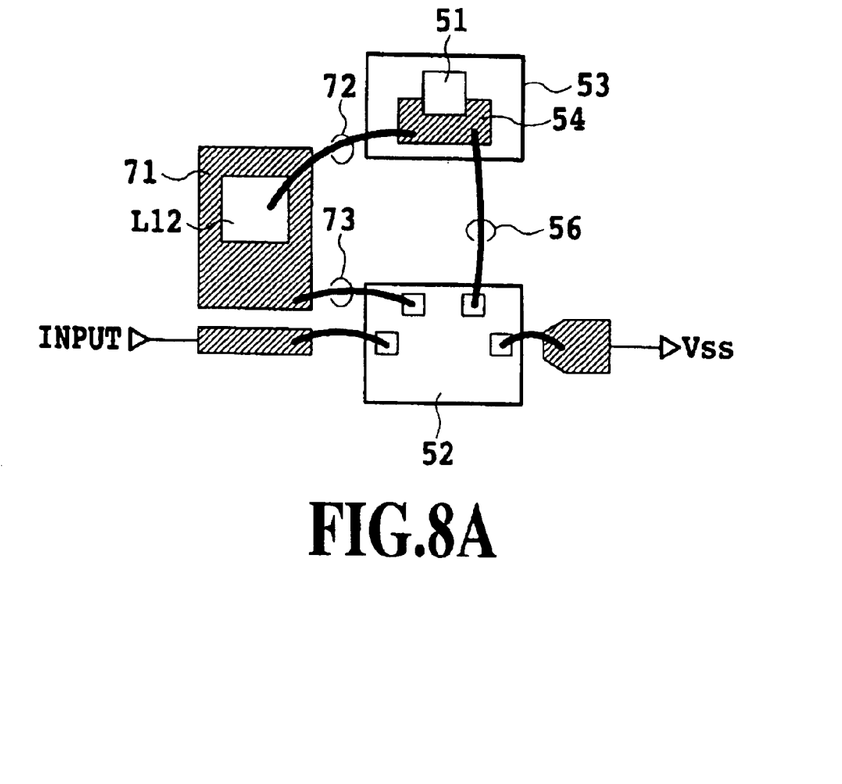
FIG. 8A is an assembly diagram showing a configuration of an optical transmitter according to a first embodiment of the present invention.
Figure 8B:
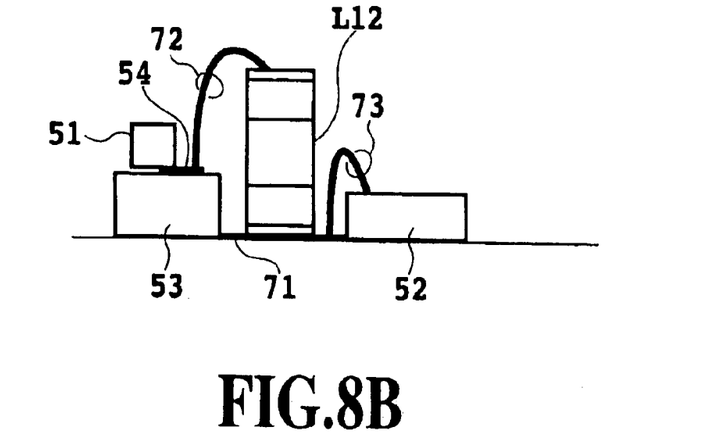
FIG. 8B is a side view showing the optical transmitter shown in FIG. 8A.

FIG. 8A shows a configuration of an optical transmitter according to a first embodiment of the present invention. A light emitting element 51 and a driving circuit are connected together via a ferrite bead inductor L12. FIG. 8B is a side view of an optical transmitter. One terminal of the ferrite bead inductor L12 is connected to the light emitting element 51 through a bonding wire 72. The other end is soldered to a pad 71.

With this configuration, the driving circuit 52 supplies a bias current to the light emitting element 51 via a bonding wire 73, the ferrite bead inductor L12, and the bonding wire 72. One of the terminals of the ferrite bead inductor L12 need not be provided with any pads. Accordingly, this terminal does not provide the capacitance component of a pad. This improves modulation characteristics in a high frequency area. Further, the inductance component of the ferrite bead is much larger than that of the bonding wire. Consequently, the AC components of a modulating current supplied to the light emitting element 51 via a bonding wire 56 do not affect a bias current supplying circuit in the driving circuit 52.

Figure 9A:
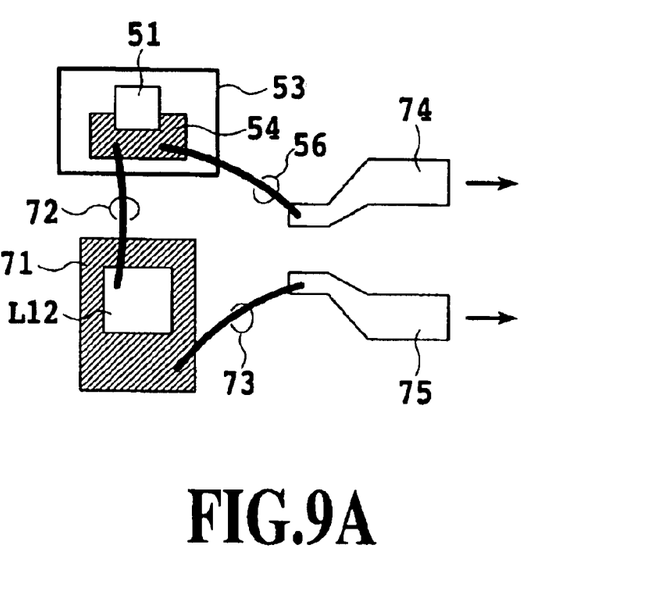
FIG. 9A is an assembly diagram showing a configuration of a light emitting element module according to an embodiment of the present invention.

FIG. 9A shows an assembled configuration of a light emitting element module according to an embodiment of the present invention. The light emitting element 51 and the driving circuit are connected together via interconnect patterns 74 and 75. The ferrite bead inductor L12 is assembled on a pad 71 so as to stand up from it. One terminal of the ferrite bead inductor L12 is connected to the light emitting element 51 via a pad 54. The other terminal is soldered to the pad 71 and connected to the interconnect pattern 75 via the bonding wire 73. The interconnect pattern 74 is connected to the light emitting element 51 via the pad 54. The driving circuit supplies a modulating current to the light emitting element 51 via the interconnect pattern 74, while supplying a bias current via the interconnect pattern 75.

Figure 9B:
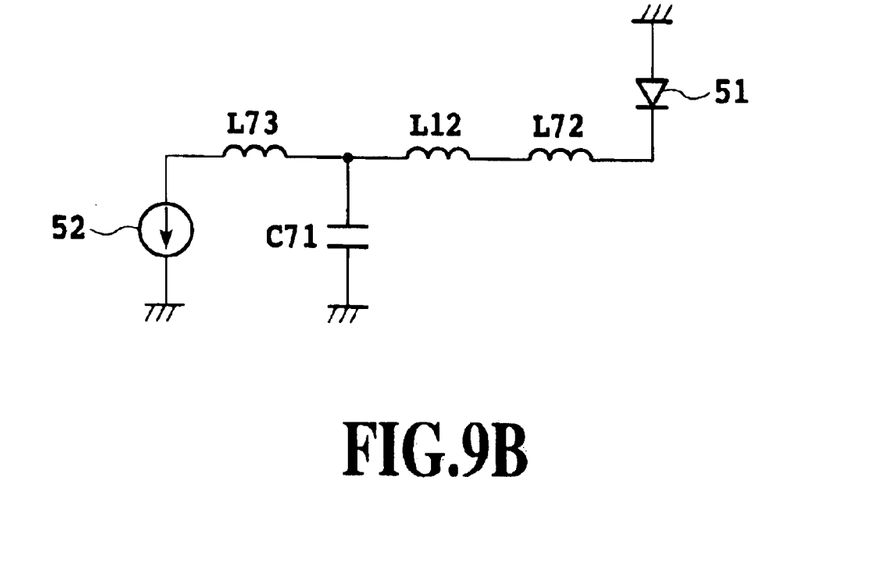
FIG. 9B is a circuit diagram showing an equivalent circuit for a bias line in the light emitting element module shown in FIG. 9A.

FIG. 9B shows an equivalent circuit for a bias line. The pad 71, on which the ferrite bead inductor L12 is mounted, has a capacitance component C71 if the substrate is made of ceramics and has its back surface grounded. One of the terminals of the ferrite bead inductor L12 need not be provided with any pads. Accordingly, this terminal does not provide the capacitance component of a pad.

In this case, high-frequency noise can be hindered using the inductance component L72 of the biasing bonding wire 72 and the ferrite bead inductor L12. Resonance does not occur because there are no capacitance components between the light emitting element 51 and the ferrite bead inductor L12. Therefore, the modulation characteristics in a high frequency area can be improved.

Figure 10A:
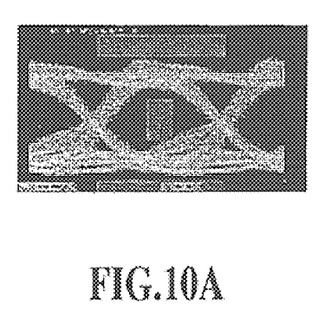
FIG. 10A is a view showing the output characteristics of an optical transmitter.
Figure 10B:
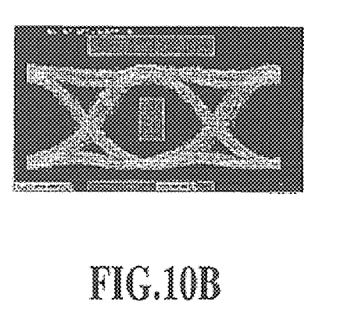
FIG. 10B is a view showing the output characteristics of the optical transmitter shown in FIG. 8A.

FIG. 10A shows, for comparison, the output characteristics of the optical transmitter shown in FIG. 2B. FIG. 10B shows the output characteristics of the optical transmitter shown in FIG. 8A. FIG. 10B shows a larger opening in an eye pattern than FIG. 10A. This indicates that the modulation characteristics in a high frequency area are improved.

Figure 11A:
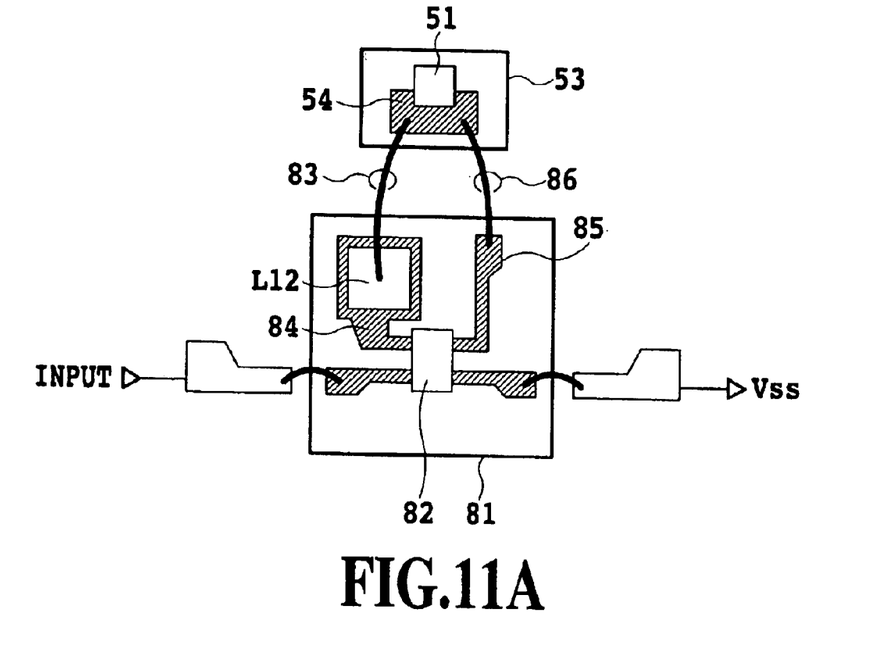
FIG. 11A is an assembly diagram showing a configuration of an optical transmitter according to a second embodiment of the present invention.

FIG. 11A shows a configuration of an optical transmitter according to a second embodiment of the present invention. The optical transmitter is composed of a heat sink 53 on which the light emitting element 51 is mounted and an interconnect substrate 81 on which a driving circuit IC 82 is mounted. The light emitting element 51 and a bias current supplying circuit in the driving circuit IC 82 are connected together via a bonding wire 83 and the ferrite bead inductor L12. The ferrite bead inductor L12 is assembled on a pad 84 so as to stand up from it. On the other hand, the light emitting element 51 and a modulating current supplying circuit in the driving circuit IC 82 are connected together via a bonding wire 86 and a pad 85.

Figure 11B:
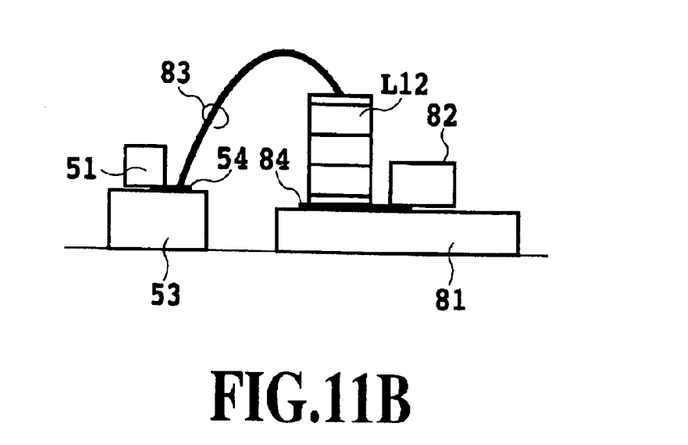
FIG. 11B is a side view showing the optical transmitter shown in FIG. 8A.

FIG. 11B is a side view of an optical transmitter. One terminal of the ferrite bead inductor L12 is connected to an electrode in the light emitting element 51 via a bonding wire 83 and a pad 54. The other terminal is soldered to the pad 84, an interconnect pattern formed on the interconnect substrate 81. With this configuration, the driving circuit IC 82 supplies a bias current to the light emitting element 51. One of the terminals of the ferrite bead inductor L12 need not be provided with any pads. Accordingly, this terminal does not provide the capacitance component of a pad. This improves the modulation characteristics in a high frequency area.

On the other hand, a modulating current for the light emitting element 51 is supplied via the bonding wire 86 and the pad 85. This makes it possible to reduce the length of the bonding wire 86. Further, reducing the area of the pad 85 enables a reduction in the capacitance formed between the pad 85 and the grounded back surface of the interconnect substrate 81.

Figure 12:
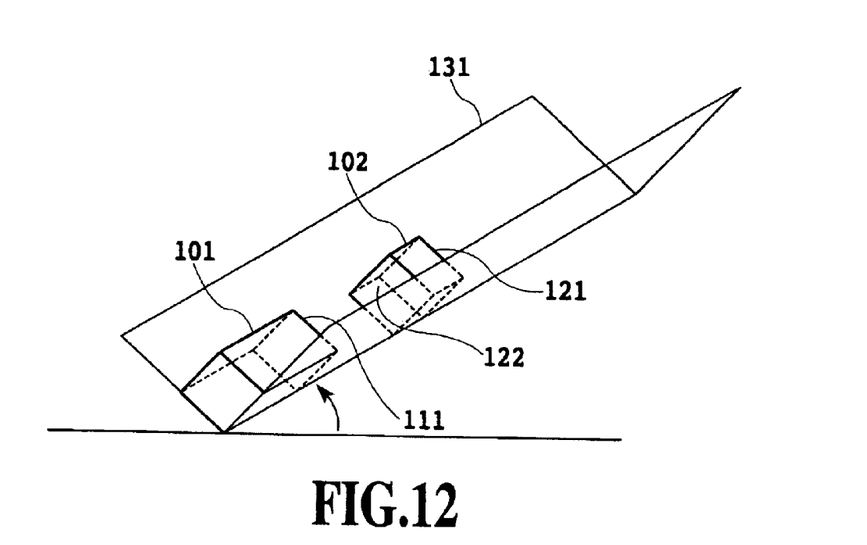
FIG. 12 is a perspective view showing a connection jig used to manufacture ferrite bead inductor according to the first embodiment of the present invention.

FIG. 12 shows a connection jig used to manufacture a ferrite bead inductor according to the first embodiment of the present invention. A terminal of a ferrite bead inductor 101 is plated with solder for soldering. Thus, the bonding wire cannot be connected to this terminal unless special measures are taken. Thus, a metal block 102 is connected to one electrode of the ferrite bead inductor 101 and has one surface 121 plated with gold and the other surface 122 plated with solder. Thus, a bonging wire can be connected to one electrode of the ferrite bead inductor via the metal block 102. The other electrode can be soldered to a pad.

The ferrite bead inductor 101 and the metal block 102 are connected together by applying solder cream 111 to one electrode of the ferrite bead inductor 101 and placing this electrode on a connection jig 131 having a V-shaped groove. One electrode of the ferrite bead inductor 101 is located opposite the other surface 122 of the metal block 102.

Figure 13:
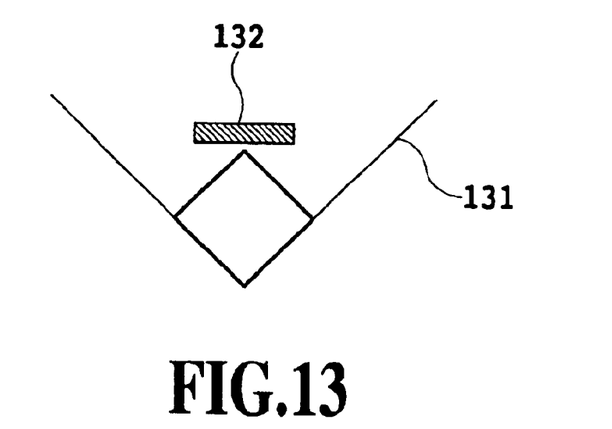
FIG. 13 is a side view showing a presser plate that fixes a ferrite bead inductor to the connection jig.

FIG. 13 shows a presser plate used to fix the ferrite bead inductor to the connection jig. Next, the presser plate 132 is used to press the ferrite bead inductor 101 and the metal block 102 against the connection jig 131 for fixation and heating the connection jig to connect both together.

Alternatively, the metal block 102 having its surface plated with gold may be connected to one electrode of the ferrite bead inductor 101.

Figure 14A:
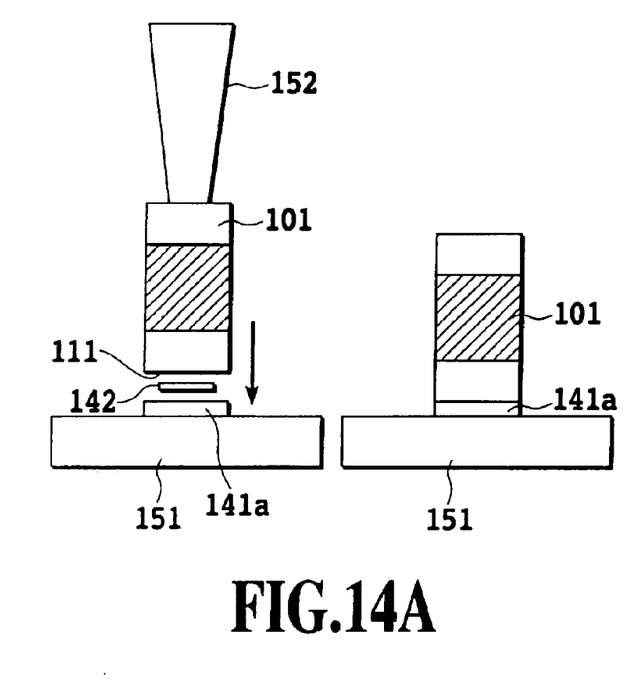
FIG. 14A is a side view showing a die bonder used to manufacture ferrite bead inductor according to a second embodiment of the present invention.

FIG. 14A shows a die bonder used to manufacture a ferrite bead inductor according to the second embodiment of the present invention. The die bonder is used to mount a metal block 141a with its surface plated with gold, on the electrode of the ferrite bead inductor 101. The ferrite bead inductor 101 is fixed to a collet 152 of the die bonder by vacuum suction. The metal block 141a is fixed to a stage 151 of the die bonder. The metal block 141a on which a solder pellet 142 has been mounted is placed on the stage 151 that has been heated up to about 320° C. Since the stage 151 has been heated, the solder pellet 152 is immediately melted. The solder can be prevented from being oxidized by maintaining a nitrogen atmosphere.

Figure 14B:
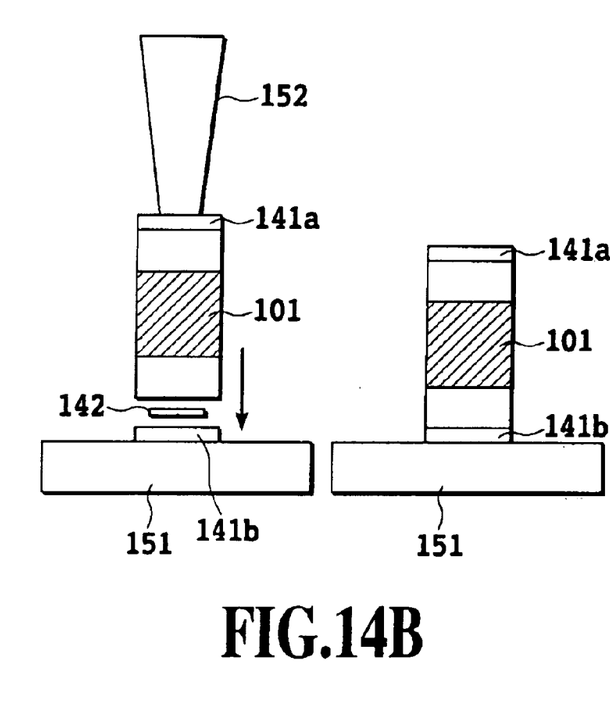
FIG. 14B is a side view showing a die bonder used to mount a metal plated electric chip to the other terminal of the ferrite bead inductor.

The stage 151 is cooled while the ferrite bead inductor 101 fixed to the collet 152 remains pressed against the metal block 141*a*. Thus, the ferrite bead inductor 101 and the metal block 141*a* are glued to each other. As shown in FIG. 14B, a metal block 141*b* is mounted on the other terminal of the ferrite bead inductor 101.

By thus gluing the metal block 141 to the terminal of the ferrite bead inductor, the bonding wire can be connected even if the terminal is made of metal other than gold. Further, by gluing the metal block to the other terminal of the ferrite bead inductor, a solder paste or a conductive resin can be used to connect ferrite bead inductor and the pad on the substrate together. The metal block can be formed of common metal such as cobal or copper with its surface plated with gold. The size of the metal block depends on the size of the terminal of the ferrite bead inductor. In the present embodiment, the metal block has a length of about 0.5 mm, a breadth of about 0.5 mm, and a thickness of about 0.2 mm.

In the present embodiment, the ferrite bead inductors are used, but other chip parts may be used. The terminals of common chip parts are subjected to solder plating, what is called Sn/Pb plating for soldering. Also, Sn plating is used for Pb-free. Therefore, the above described method may be used to mount metal blocks or chip parts having Au- or Ag-Pd-plated terminals may be used. Further, the bonding wire as connection member is not limited to the Au-wire but may be an Al- or Cu-wire or a bonding ribbon.

Furthermore, the functional IC is applicable not only to a pre-amplifier or main amplifier used in an optical receiver for an optical transmission system but also to a traveling-wave-type amplifier. Further, the functional IC is applicable to any circuits that supply a direct current via an inductor similarly to the above described bias Tee circuit.

The present invention has been described in detail with respect to preferred embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. An optical module comprising:

a light emitting element having an electrode to which a bias current is supplied;

an interconnect substrate on which an interconnect pattern is formed to supply said bias current; and an inductor part having one terminal connected to said electrode using a connection member and the other terminal connected to said interconnect pattern.

2. An optical module as claimed in claim 1, further comprising a driving circuit connected to said interconnect pattern to supply said bias current to said light emitting element.

3. An optical module as claimed in claim 2, wherein said driving circuit includes a bias current supplying circuit that supplies said bias current and a modulating current supplying circuit that supplies a modulating current to said light emitting element, said bias current supplying circuit is connected to said interconnect pattern, and said modulating current supplying circuit is connected to said electrode without using said inductor part.

4. An optical module as claimed in claim 1, wherein said connection member is a bonding wire or a bonding ribbon.

5. An optical module as claimed in claim 1, wherein said one terminal is plated with gold.

6. An optical module as claimed in claim 1, wherein said inductor part includes:

a first metal block plated with gold; and an inductance element having a first terminal to which said first metal block is connected and a second terminal.

7. An optical module as claimed in claim 1, wherein said first terminal and said second terminal are plated with at least one of solder, tin, and gold.

8. An optical module as claimed in claim 6, wherein said inductor part includes a second metal block plated with gold, and said second metal block is connected to said second terminal.

9. An optical module as claimed in claim 8, wherein said first terminal and said second terminal are plated with solder.

* * * * *